United States Patent [19]

Kondo et al.

[11] Patent Number: 4,583,002

[45] Date of Patent: Apr. 15, 1986

[54] IMAGING SENSOR WITH AUTOMATIC SENSITIVITY CONTROL COMPRISING VOLTAGE MULTIPLYING MEANS

[75] Inventors: Ryuji Kondo, Sunnyvale; Makoto Shizukuishi, San Jose, both of Calif.

[73] Assignee: Fuji Photo Film Co., Ltd., Kanagawa, Japan

[21] Appl. No.: 501,730

[22] Filed: Jun. 6, 1983

[51] Int. Cl.[4] .............................................. H01J 40/14
[52] U.S. Cl. ............................... 250/578; 250/211 J; 358/213
[58] Field of Search ........................... 250/578, 211 J; 358/212, 213, 160, 161; 357/31, 32

[56] References Cited

U.S. PATENT DOCUMENTS

| | | | |
|---|---|---|---|
| 3,944,816 | 3/1976 | Harada | 250/211 J |
| 4,334,151 | 6/1982 | Herbst et al. | 250/211 J |
| 4,338,514 | 7/1982 | Bixby | 250/578 |
| 4,340,819 | 7/1982 | Ogasawara et al. | 250/578 |
| 4,471,228 | 9/1984 | Nishizawa et al. | 250/578 |
| 4,479,062 | 10/1984 | Kawasaki et al. | 358/213 |

*Primary Examiner*—David C. Nelms
*Assistant Examiner*—J. Gatto
*Attorney, Agent, or Firm*—Sughrue, Mion, Zinn, Macpeak and Seas

[57] ABSTRACT

A solid-state imaging sensor in which the sensitivity of the sensor is automatically adjusted in accordance with the overall intensity of the image being sensed. A charging potential applied to an image signal storage capacitor in each pixel of an array of pixels of which the sensor is composed is dynamically varied as the overall intensity of the image being sensed changes. A voltage multiplying circuit, which may be either light sensitive or light insensitive, supplies the variable charging potential. If the voltage multiplying circuit is light insensitive, an elongated photodiode is provided along two sides of the sensor array to adjust the charging potential.

7 Claims, 9 Drawing Figures

IMAGING SENSOR WITH AUTOMATIC SENSITIVITY CONTROL COMPRISING VOLTAGE MULTIPLYING MEANS

BACKGROUND OF THE INVENTION

The invention pertains to a solid-state imaging sensor having provision for automatically adjusting the sensitivity of the device in accordance with changes in the average level of the image being sensed.

A prior art imaging sensor of the same general type to which the invention pertains is illustrated in FIG. 1. In this arrangement, an imaging sensor array 5 is provided which includes a plurality of rows and columns of pixels (picture elements) 10, each of which is sensitive to light in a corresponding portion of the image being sensed. The pixels 10 are arranged at intersections of horizontally extending electrodes 21-1 to 21-4, which are coupled to corresponding outputs of a vertical shift register 20, and vertically extending electrodes 33-1 to 33-4, which are coupled through respective FET switching devices 32-1 to 32-3 to output circuitry. The output circuitry includes a resistor 23 connected between an output line 24 and ground or another reference potential. An operational amplifier supplying a virtual ground to the output line 24 may be used in place of the resistor 23. The gates of the devices 32-1 to 32-4 are coupled to respective outputs 31-1 to 31-4 of a horizontal shift register 30. In FIG. 1, only a three-by-three matrix of pixels is shown for convenience in illustration; in practice, of course, many more pixels would be employed.

As further indicated in FIG. 1, the equivalent circuit of each pixel 10 includes an FET device 12 having a gate coupled to a respective one of the horizontally extending electrodes 21-1 to 21-4 and a drain connected to a corresponding one of the vertically extending electrodes 33-1 to 33-4. Each pixel includes a diode 13 having an anode coupled to ground and a cathode coupled to the source terminal of the corresponding FET device 12. Light sensing current is supplied to the cathode of the diode 13 through a parallel-connected resistor 14 and capacitor 15, the opposite terminals of which are connected to a source of a fixed voltage $V_T$.

All of the components illustrated in FIG. 1 are preferably formed on a single integrated circuit chip. Referring momentarily to FIG. 2, there is shown a cross-sectional view through such a chip indicating generally the construction of one of the pixels 10. The array is constructed upon a P-type substrate 40. N+ source and drain diffusions 41 and 44, respectively, are formed in the P-type substrate 40. Field oxide regions 45 and 46 serve to isolate the source and drain diffusions from adjacent pixels. A metal layer 48 contacts the source diffusion 41 and extends over the majority of the area of the chip occupied by this particular pixel. A channel 43 is formed under a gate electrode 42, which forms a part of one of the horizontally extending electrodes 21-1 to 21-4. The layer 48 and the electrode 42 are insulated from one another by an oxide layer 47, The oxide layer 47 and the metal layer 48 are covered by a photoconductive film 49. A transparent conductive electrode 50 is formed above the film 49. A voltage source 51, which supplies the fixed voltage $V_T$ from a position off the chip, is connected to the transparent electrode 50.

Referring back to FIG. 1, to read out the pixels of the sensor array 5, the electrodes 21-1 to 21-4 are activated in sequence by the vertical shift register 20 by applying positive pulses to the electrodes 21-1 to 21-4 in sequence. While, for instance, the electrode 21-2 has a positive voltage applied thereto by the vertical shift register 20, each of the pixels 10 in the row of pixels served by the electrode 21-2 are read out in sequence by sequentially turning on the FET devices 32-1 to 32-3 by applying, again in sequence, positive pulses to the gates of the devices 32-1 to 32-3 from respective outputs 31-1 to 31-4 of the horizontal shift register 30.

When the FET devices 12 and 32-1 are both turned on, the capacitor 15 is connected through the resistor 23 between ground and the potential $V_T$, and hence charged to $V_T$. When the devices 12 and 32-1 are subsequently turned off, the capacitor 15 is free to be discharged through the resistor 14, the resistance of which varies in accordance with the intensity of light shining on the pixel 10. Thus, the amount of discharging which occurs between read-out operations is determined by the integrated (mean) intensity of the light which shone on the pixel 10 during the time period between read-out operations. Therefore, during each pixel read-out operation, the voltage developed across the resistor 23 is a measure of the mean light intensity which shone on the respective pixel 10 in the time interval following the immediately previous read-out operation.

The arrangement of FIGS. 1 and 2 suffered from a significant drawback in that the pixels could saturate in the presence of an intense sensed image. That is, if the image being sensed is sufficiently intense, large numbers, or possibly all, of the pixels could become saturated due to the respective capacitors 15 being fully discharged between read-out periods. In such a case, no output picture information can be obtained.

One prior art approach to solving this problem was to provide a mechanical shutter for the camera employing the imaging sensor. The mechanical shutter could be adjusted, either manually or automatically, until a satisfactory output signal was obtained. Although the use of a mechanical shutter did solve the problem of saturation, mechanical shutters are disadvantageous in that they are relatively expensive, their operation is slow, and they are less reliable than semiconductor circuits.

Accordingly, it is an object of the present invention to provide a solid-state imaging sensor in which pixel saturation is prevented over a wide range of light amplitudes without having to provide a mechanical shutter.

SUMMARY OF THE INVENTION

These, as well as other objects of the invention, are met by a solid-state imaging sensor including a plurality of pixels arranged in a maxtrix with each of the pixels including capacitive storage means, photoconductive means for charging the capacitive storage means in accordance with an intensity of light shone on the respective pixel, and means for supplying a charging potential to each of the capacitive storage means having a magnitude determined in accordance with the intensity of light shone on the sensor. In all preferred embodiments, the charging potential supplying means is a voltage multiplying means, which in some embodiments is light sensitive and in others it is not. In either case, the voltage multiplying means and the plurality of pixels are preferably formed on a single semiconductor substrate. The charging potential supplying means may also be implemented as means for applying a predetermined potential to the capacitive storage means and photodiode means for reducing the predetermined potential in accordance with the intensity of light shone on the sensor. In this case, the means for applying the predetermined potential to the capacitive storage means is preferably a non-light-sensitive voltage multiplying means. The photodiode means may be disposed along at least two sides of the matrix of pixels.

In more detail, in terms of circuit construction, the invention can be practiced by a solid-state imaging sensor including first and second sets of electrodes, a plurality of pixels formed in a matrix, and means for supplying a charging potential used within the pixels with a magnitude determined in accordance with an intensity of light shone on the sensor. The electrodes of both the first and second sets of electrodes are generally parallel within the set, and the first and second sets of electrodes are arranged generally perpendicular to one another. Each of the pixels is formed at an intersection of a respective electrode of the first set of electrodes and a respective electrode of the second set of electrodes. Each of the pixels includes an FET device having a drain coupled to a respective electrode of the first set and a gate coupled to a respective electrode of the second set, a photodiode coupled between the source of the FET device and a reference potential (ground) terminal, and a capacitor coupled between the source of the FET device and a terminal to which the charging potential is applied. The means for supplying the charging potential includes a source of a fixed potential and voltage multiplying means coupled between the source of the fixed potential and the charging potential terminal. The voltage multiplying means may be a light-sensitive voltage multiplying device. In this case, it includes a plurality of FET devices having channels (the variably conductive channels formed between source and drain terminals) coupled in series with one another and gates coupled to corresponding sources. An FET device at one end of the string of series-coupled FET devices has a source coupled to receive the fixed potential and an opposite end one of the series-coupled FET devices has a drain coupled to the charging potential terminal. Capacitors are provided having first terminals coupled to the sources of respective ones of the series-connected devices, and respective photodiodes are coupled between second terminals of the capacitors and the reference potential terminal. Even- and odd-ordered ones of the second terminals of the capacitors are interconnected for supplying thereto oppositely phased driving signals. Specifically, the first, third, fifth, etc., ones of the capacitors have second terminals coupled to a source of a first square-wave signal, while second, fourth, sixth, etc., ones of the capacitors have second terminals coupled to a source of a second square-wave signal shifted 180° in phase from the first square wave signal.

In another embodiment, the voltage multiplying means is not light-sensitive. In this case, variation of the potential applied to the charging potential terminal is effected by elongated photodiodes arranged along at least two sides of the matrix of pixels with these photodiodes being coupled between the charging potential terminal, which takes the form of a transparent electrode connected to all pixels, and the reference potential terminal.

In terms of semiconductor structure, each pixel includes a source diffusion and a drain diffusion formed in one surface of a semiconductor substrate. One of the electrodes of the first set of electrodes forms a gate between the source and drain diffusions in each pixel. To the source diffusion is connected a layer of amorphous semiconductor material which extends over the major portion of the area of the substrate occupied by the respective pixel. A transparent electrode overlies the entire matrix of pixels and contacts the amorphous semiconductor layer of each pixel. In the case where elongated photodiodes are provided along at least two sides of the matrix of pixels, a diffusion of the same type as the source and drain diffusions of the pixels is formed parallel to the two sides of the matrix of pixels. This diffusion is interconnected with the transparent electrode.

DESCRIPTION OF THE PREFERRED EMBODIMENTS

Figure 1:
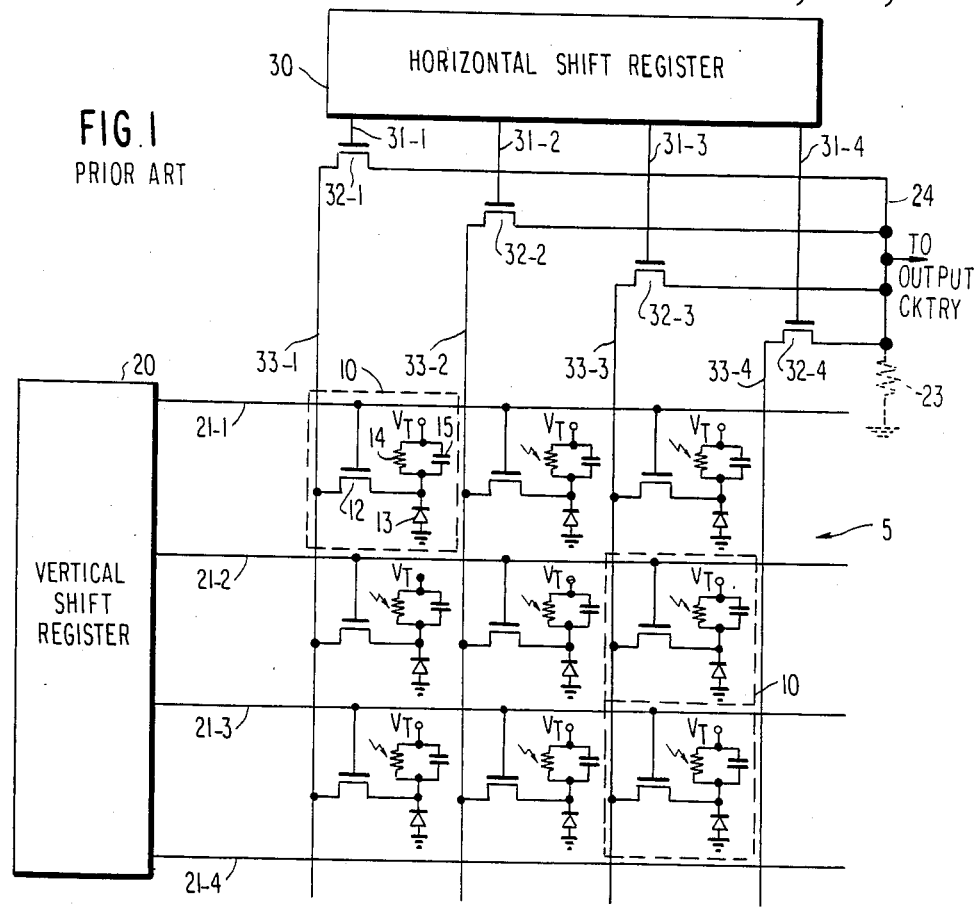
FIG. 1 is a schematic diagram of a prior art solid-state imaging sensor of the same general type to which the invention pertains.

The gain (or sensitivity) of one of the pixels 10 in the solid-state imager of FIG. 1 can be represented by:

$$G = (\tau\mu/L^2)V_T^*$$

where G is the gain, $\tau$ is the free carrier lifetime, $\mu$ is the carrier mobility, L is the electrode spacing, and $V_T$ is the charging potential.

* Sze, Physics of Semiconductor Devices, part IV, c.12.

Thus, by varying the term $V_T$, the sensitivity of the pixel can be altered. The invention takes advantage of the fact that the pixel sensitivity can be varied in this way.

Figure 3:
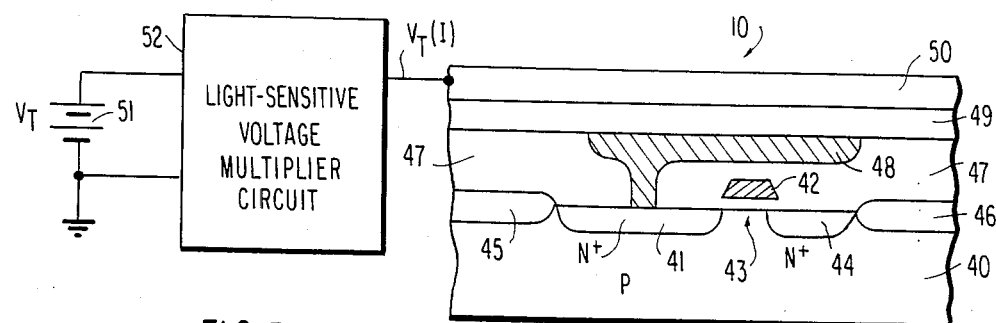
FIG. 3 is a view similar to FIG. 2 but showing a solid-state imaging sensor constructed in accordance with the invention.

Referring now to the view of FIG. 3, in accordance with a first embodiment of the invention, a light-sensitive voltage multplier circuit 52 is interposed between the fixed voltage source 51 and the conductive electrode 50, that is, the electrode which carries the potential $V_T$ which is applied to one terminal of the capacitors 15 during read-out periods. The voltage multiplier circuit should be located where it will receive a portion of the light directed onto the array. It is the purpose of the light-sensitive voltage multiplier circuit 52 to produce from a fixed voltage $V_T$, a variable voltage $V_T(I)$ which varies in accordance with the average intensity I of light shone on the sensor. Specifically, when a pattern of very high intensity is being sensed, the voltage $V_T(I)$ is reduced to thereby reduce the sensitivity of the sensor and hence prevent saturation. Thus, with the invention there is no need for a mechanical shutter.

Figure 4:
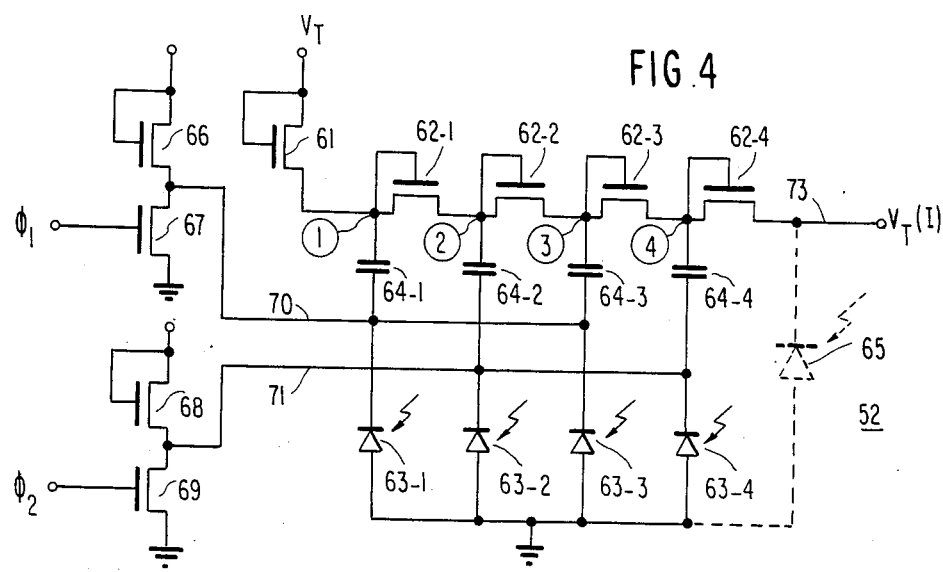
FIG. 4 is a schematic diagram of a light-sensitive voltage multiplier circuit utilized in the imager of FIG. 3.

FIG. 4 is a schematic diagram of the light-sensitive voltage mutliplier circuit 52 shows in FIG. 3. The voltage multiplier circuit includes a plurality of FET devices 62-1 to 62-4 having conductive channels connected in series with one another. (Four such devices are shown here only by way of example as ordinarily many more such devices would be provided.) The gates of the devices 62-1 to 62-4 are connected to the sources of the same devices. A single FET device 61 is coupled between the fixed potential $V_T$ and the source of the device 62-1.

Capacitors 64-1 to 64-4 have first terminals coupled to sources of respective ones of the FET devices 62-1 to 62-4. Second terminals of each of the capacitors 64-1 to 64-4 are connected to cathodes of respective photodiodes 63-1 to 63-4, anodes of which are connected to ground. The second terminals of even-ordered ones (64-2, 64-4) of the capacitors 64-1 to 64-4 are interconnected as are second terminals of odd-ordered ones (64-1, 64-3) of the capacitors 64-1 to 64-4. The interconnection points, 70 and 71, respectively, are provided with driving signals $\phi_1$ and $\phi_2$ via drivers composed of FET devices 66, 67, 68 and 69 connected in a well known manner. A photodiode 65 (shown in phantom and explained in further detail below) is provided in some embodiments.

Figure 5:
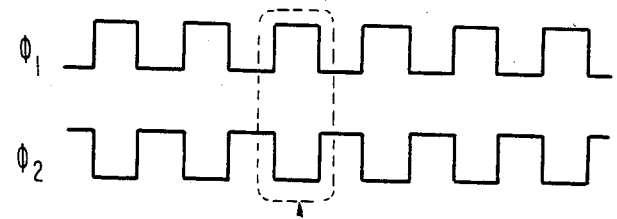
FIG. 5 is a waveform diagram used for explaining the operation of the circuit of FIG. 4.
Figure 5:
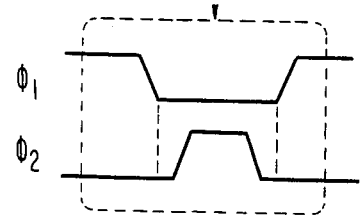

The driving signals $\phi_1$ and $\phi_2$ are illustrated in the timing diagram of FIG. 5. Preferably, as illustrated in the bottom portion of FIG. 5, the low state of the driving signal $\phi_1$ overlaps the high state of the driving signal $\phi_2$ for both rising and falling edges of the driving signal $\phi_2$.

In operation, a charge initially stored at a node 1 is transferred in sequence through nodes 2, 3 and 4 to an output terminal 73 in a "bucket-brigade" type operation under the control of the driving signals $\phi_1$ and $\phi_2$. As the charge packet progresses along the line, it may be diminished in magnitude by portions of the charge flowing through ones of the photodiodes 63-1 to 63-4 with the higher the intensity shone on the diodes 63-1 to 63-4, the more charge will be depleted, and hence the lower will be the voltage $V_T(I)$ finally produced on the output terminal 73.

Figure 6A:
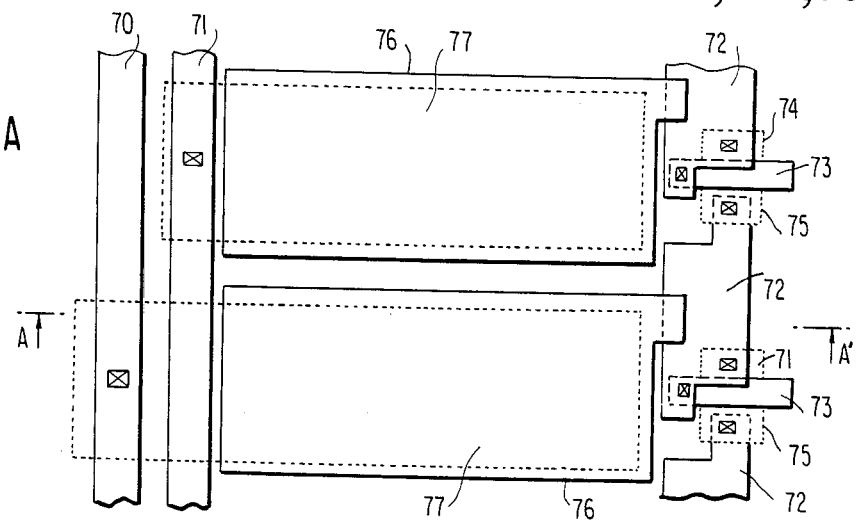
FIG. 6A is a top view and FIG. 6B is a cross-sectional view of an integrated circuit implementation of the circuit of FIG. 4.
Figure 6B:
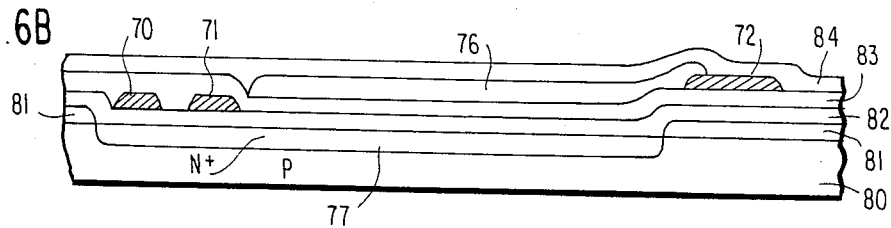

FIGS. 6A and 6B show, respectively, a top view and a cross-sectional view of an integrated circuit implementation of the circuit of FIG. 4, with FIG. 6B being taken along a line A—A' in FIG. 6A. Diffusions 77 (dotted lines) are formed in a substrate 80. Preferably, the substrate is of the P type, while the diffusions 77 are of the N+ type. Alternate ones of the diffusions 77 are coupled to alternate ones of parallel conductors 70 and 71. Transparent electrodes 76 are formed over the diffusions 77 in the pattern shown. Preferably, the transparent electrodes 76 are formed with ITO (Indium Tin Oxide), although polysilicon can be used with some reduction in sensitivity to blue light. Each transparent electrode 76 is coupled to a respective connector 72. A second connector 73, preferably fabricated with polysilicon material, extends from a lower edge of the respective connector 73, preferably fabricated with polysilicon material, extends from a lower edge of the respective connector 72 between source and drain diffusions 74 and 75, spaced from the surface of the substrate by a thin oxide layer. The FET devices 62-1 to 62-4 are thus formed between corresponding source and drain diffusions 74 and 75. Each connector 72 links a drain diffusion 75 with a source diffusion 74 of an adjacent cell. A passivation layer 84 is formed over the entire circuit for purposes of protection.

Figure 7:
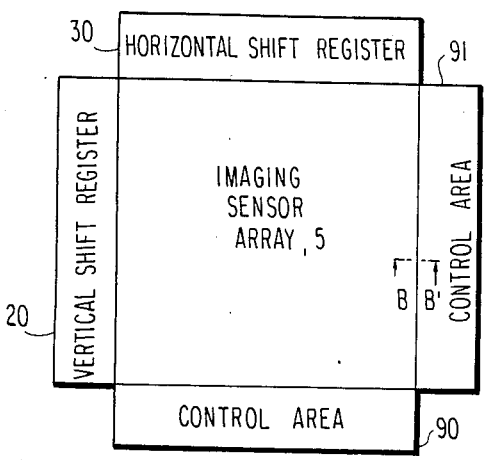
FIG. 7 is a top view of a solid-state imaging sensor of another embodiment of the invention.
Figure 8:
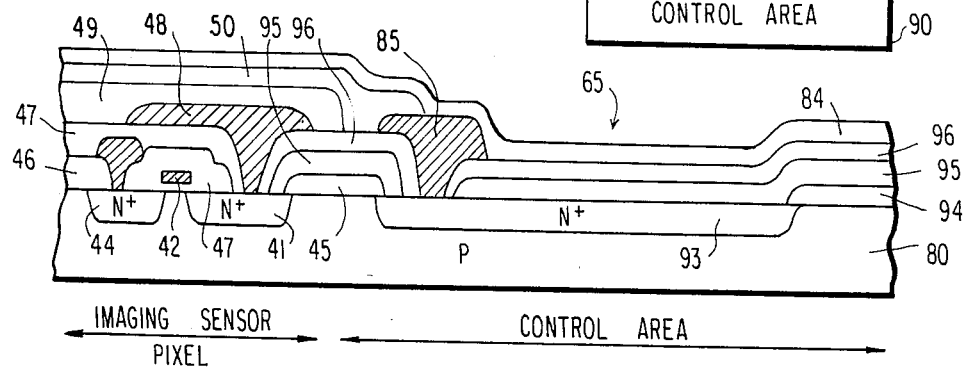
FIG. 8 is a cross-sectional view taken along a line B—B' in FIG. 7.

Another embodiment of the invention is illustrated in FIGS. 7 and 8. In accordance with this embodiment, the voltage multiplier circuit of FIG. 3 is still provided, but it is rendered insensitive to light, for instance, by replacing the transparent electrodes 76 with opaque metal layers. To control the sensitivity of the imager in accordance with the light shone on the imager, control areas 90 and 91 are provided on two sides of the imaging sensor array 5. It is the purpose of the control areas 90 and 91 to vary the load imposed upon the voltage multiplying circuit in accordance with the intensity of the light shone upon the imager to thus vary the charging voltage applied to the capacitors 15.

Figure 2:
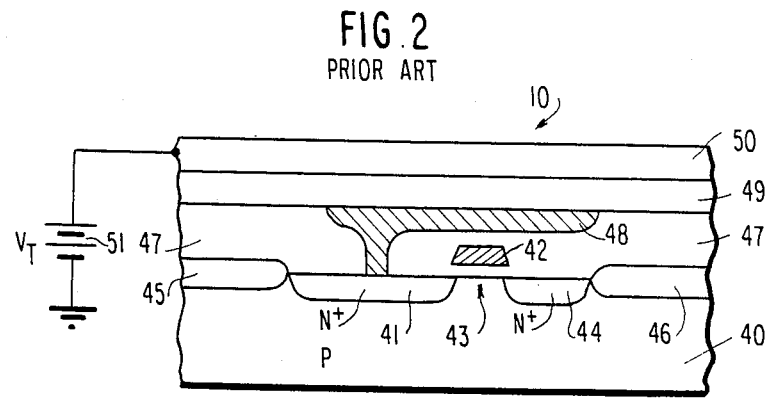
FIG. 2 is a cross-sectional view of a portion of one of the pixels of the sensor FIG. 1.

As shown in the cross-sectional view of FIG. 8, which is taken along a line B—B' in FIG. 7, the control area 91 is added adjacent the imaging sensor array 5 on the same semiconductor substrate. The pixel construction is the same as that depicted in FIGS. 2 and 3. The control area 91 includes an N+ diffusion 93 formed in the substrate 80. The N+ diffusion 93 is connected by a metal connector 85 to the transparent electrode 50. The N+ diffusion 93 is covered by a PSG (phosphor glass) layer 95, a vaporized oxide layer 96, and the passivation layer 84.

In operation, when the intensity of light reaching the control areas 90 and 91 is relatively low, the photodiode formed by the N+ diffusion 93 and the substrate 80 conducts very little, and hence little additional load is imposed upon the voltage multiplier circuit. As the intensity of light increases, the photodiode 65 conducts more heavily (has a lower resistance), thereby providing an increased load, via the transparent electrode 50, on the voltage multiplier circuit and hence lowering $V_T(I)$.

In a yet further embodiment, the embodiments of FIGS. 4 and 7 are combined, that is, a light-sensitive voltage multiplier circuit is used with the embodiment of FIG. 7. This arrangement is advantageous in applications where the expected range of light intensity to be handled by the sensor is quite wide and additional control is needed.

This completes the description of the preferred embodiments of the invention. Although preferred embodiments have been described, it is believed that numerous alternations and modifications thereto would be apparent to one of ordinary skill in the art without departing from the spirit and scope of the invention.

We claim:

1. A solid-state imaging sensor comprising:
a plurality of pixels arranged in a matrix, each of said pixels comprising capacitive storage means and photoconductive means for charging said capacitive storage means in accordance with an intensity of light shone on said pixels;
means for supplying charging potential to said photoconductive means having a magnitude determined in accordance wtih an intensity of light shone on said sensors; and
wherein said charging potential supplying means comprises light-sensitive voltage multiplying means.

2. The solid-state imaging sensor of claim 1 wherein said voltage multiplying means and said plurality of pixels are formed on a single semiconductor substrate.

3. A solid-state imaging sensor comprising:
a first set of generally parallel electrodes;

a second set of generally parallel electrodes arranged generally perpendicular to said first set of electrodes and insulated therefrom;

a plurality of pixels, each of said pixels being arranged at an intersection of a respective electrode of said first set of electrodes and a respective electrode of said second set of electrodes, each of said pixels comprising an FET device having a drain coupled to said respective electrode of said first set of electrodes and a gate coupled to said respective electrode of said second set of electrodes, a photodiode coupled between a source of said FET device and a reference potential terminal, and a capacitor coupled between said source of said FET device and a charging potential terminal; and means for supplying a potential to said charging potential terminal having a magnitude determined in accordance with an intensity of light shone on said sensor, said potential supplying means comprising a source of a fixed potential and voltage multiplying means coupled between said source of said fixed potential and said charging potential terminal.

4. The solid-state imaging sensor of claim 3, wherein said voltage multiplying means comprises light-sensitive voltage multiplying means.

5. The solid-state imaging sensor of claim 4, wherein said voltage multiplying means comprises:

a plurality of FET devices having channels coupled in series with one another and gates coupled to corresponding sources, an end one of said series-coupled FET devices having a source coupled to said source of said fixed potential and an opposite end one of said series-coupled FET devices having a drain coupled to said charging potential terminal;

a plurality of capacitors, each of said capacitors having a first terminal coupled to a source of a respective one of said series-connected FET devices;

a plurality of photodiodes, each of said photodiodes being coupled between a second terminal of a respective one of said capacitors and said reference potential terminal; and first and second means for interconnecting even- and odd-ordered ones, respectively, of said second terminals of said capacitors for supplying oppositely phased driving signals to said even- and odd-ordered second terminals of said capacitors.

6. A solid-state imaging sensor comprising:

a plurality of pixels arranged in a matrix, each of said pixels comprising capacitive storage means and photoconductive means for charging said capacitive storage means in accordance with an intensity of light shone on said pixels;

means for supplying charging potential to said photoconductive means having a magnitude determined in accordance with an intensity of light shone on said sensors;

wherein said charging potential supplying means comprises means for applying a predetermined potential to said capacitive storage means and photodiode means connected between said supplying means and said storage means for reducing said predetermined potential in accordance with said intensity of light shone on said sensor; and wherein said means for applying said predetermined potential comprises non-light-sensitive voltage multiplying means.

7. The solid-state imaging sensor of claim 6, wherein said photodiode means is disposed along at least two sides of said matrix of pixels.

* * * * *